(12) United States Patent
Weizenecker et al.

(10) Patent No.: US 7,728,591 B2
(45) Date of Patent: Jun. 1, 2010

(54) IMAGING REGION-SPECIFIC RADIO FREQUENCY COILS FOR MRI

(75) Inventors: Jurgen Weizenecker, Hamburg (DE); Christoph Schroeder, Berlin (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/091,302

(22) PCT Filed: Oct. 3, 2006

(86) PCT No.: PCT/IB2006/053617

§ 371 (c)(1),
(2), (4) Date: Apr. 24, 2008

(87) PCT Pub. No.: WO2007/049167

PCT Pub. Date: May 3, 2007

(65) Prior Publication Data

US 2008/0284436 A1   Nov. 20, 2008

Related U.S. Application Data

(60) Provisional application No. 60/731,098, filed on Oct. 28, 2005.

(51) Int. Cl.
*G01V 3/00* (2006.01)
(52) U.S. Cl. .................................................. 324/318
(58) Field of Classification Search ......... 324/300–322; 600/410–435; 333/219–235; 343/725–730, 343/741–748, 767–771, 787–788, 850–873, 343/876, 893, 904–916
See application file for complete search history.

(56) References Cited

U.S. PATENT DOCUMENTS 4,793,356 A * 12/1988 Misic et al. ................. 600/422

(Continued)

FOREIGN PATENT DOCUMENTS

EP          0844489 A1     5/1998

(Continued)

OTHER PUBLICATIONS

Lawrence, et al., "An Inverse Design of an Open, Head/Neck RF Coil for MRI," IEEE Trans. on Biomedical Engineering, 49(9), Sep. 2002, pp. 1024-1030.

(Continued)

*Primary Examiner*—Brij B Shrivastav
*Assistant Examiner*—Dixomara Vargas

(57) ABSTRACT

A radio frequency coil includes a non-cylindrical conformal surface (62, 76) that substantially conforms with a magnetic resonance subject. A plurality of conductor loops (60, 71, 72, 73, 74) are disposed in or on the non-cylindrical conformal surface. The plurality of conductor loops are configured to produce a substantially uniform Bi field in the magnetic resonance subject responsive to energizing at a Bi frequency. Optionally, a plurality of load-compensating conductor loops (90) are disposed in or on a compensatory non-cylindrical conformal surface (62) that substantially conforms with a magnetic resonance subject. The plurality of load-compensating conductor loops are configured to produce a non-uniform Bi field that compensates for a loading Bi non-uniformity caused by the magnetic resonance subject. Moreover, the coil may comprise switching means for switching the coil between a first mode of operation (e.g. a volume transmit mode) and a second mode of operation (e.g. a phased array reception mode).

20 Claims, 5 Drawing Sheets

U.S. PATENT DOCUMENTS

| | | | |
|---|---|---|---|
| 4,920,318 A * | 4/1990 | Misic et al. | 324/318 |
| 5,045,792 A | 9/1991 | Mehdizadeh | |
| 5,111,146 A | 5/1992 | Kuhn | |
| 5,196,796 A * | 3/1993 | Misic et al. | 324/322 |
| 5,543,710 A * | 8/1996 | Jones | 324/318 |
| 5,575,287 A | 11/1996 | Eydelman | |
| 5,600,244 A | 2/1997 | Jensen et al. | |
| 5,682,098 A | 10/1997 | Vij | |
| 5,998,999 A * | 12/1999 | Richard et al. | 324/318 |
| 6,023,166 A | 2/2000 | Eydelman | |
| 6,023,167 A | 2/2000 | DeMeester | |
| 6,043,658 A | 3/2000 | Leussler | |
| 6,323,648 B1 * | 11/2001 | Belt et al. | 324/322 |
| 6,424,154 B1 | 7/2002 | Young | |
| 6,608,480 B1 | 8/2003 | Weyers | |
| 6,624,633 B1 * | 9/2003 | Zou et al. | 324/318 |
| 6,771,071 B1 | 8/2004 | Wright et al. | |
| 6,812,700 B2 | 11/2004 | Fahrig et al. | |
| 6,900,636 B2 | 5/2005 | Leussler | |
| 6,906,518 B2 | 6/2005 | Leussler | |
| 7,026,818 B2 * | 4/2006 | Machida et al. | 324/322 |
| 7,176,689 B2 * | 2/2007 | Machida et al. | 324/318 |
| 7,245,127 B2 * | 7/2007 | Feng et al. | 324/318 |
| 7,253,621 B2 * | 8/2007 | Steen et al. | 324/318 |

FOREIGN PATENT DOCUMENTS

| | | |
|---|---|---|
| WO | 2004027442 A1 | 4/2004 |
| WO | 2004048987 A2 | 6/2004 |
| WO | 2004092760 A1 | 10/2004 |

OTHER PUBLICATIONS

Lawrence, et al., "A Time-Harmonic Inverse Methodology for the Design of RF Coils in MRI," IEEE Trans. on Biomedical Engineering, 49(1), Jan. 2002, pp. 64-71.

Fujita, et al., "A Hybrid Inverse Approach Applied to the Design of Lumped-Element RF Coils," IEEE Trans. on Biomedical Engineering, 46(3), Mar. 1999, pp. 353-361.

* cited by examiner

IMAGING REGION-SPECIFIC RADIO FREQUENCY COILS FOR MRI

CROSS REFERENCE TO RELATED APPLICATIONS

This application claims the benefit of U.S. Provisional Application Ser. No. 60/731,098 filed Oct. 28, 2005, which is incorporated herein by reference.

BACKGROUND

The following relates to the magnetic resonance arts. It finds particular application in radio frequency coils for magnetic resonance imaging, and will be described with particular reference thereto. It finds application more generally in conjunction with magnetic resonance imaging, magnetic resonance spectroscopy, and other magnetic resonance applications.

In bore-type magnetic resonance scanners, the transmit coil is typically a birdcage-type coil including a plurality of rungs arranged as a cylinder and terminated by end-rings, end-caps, or so forth. Under radio frequency excitation at a magnetic resonance frequency, these coils generate a rotating $B_1$, magnetic field that is substantially homogeneous over an imaging volume inside the birdcage-type coil. In whole-body coils, the cylindrical birdcage coil is typically arranged coaxially with the bore of the magnetic resonance scanner, and excites a large volume. For certain applications, a smaller birdcage coil is designed and arranged to image an anatomical region or other region of interest. For example, a head coil may be sized to fit over a medical patient's head to facilitate brain imaging or other head imaging. A smaller local birdcage coil can provide better electromagnetic coupling with the region of interest, and employs less radio frequency power as compared with a whole-body coil.

The excited magnetic resonance can be collected by the same coil used for the transmit phase (that is, a transmit/receive coil), or can be collected using a dedicated receive coil, such as a surface coil disposed close to the imaging region. In parallel imaging techniques such as SENSE, an array of receive coils are used in parallel, with suitable data processing performed to generate a composite image from the data acquired by the plurality of coils.

Space constraints can make providing a receiving coil array that is separate from the transmit coil problematic. For example, a birdcage head coil leaves little room for an additional array of surface receive coils. In one approach for addressing this problem, the birdcage transmit coil can be selectively configurable as a degenerate coil in which the mesh loops are decoupled. The birdcage coil is typically used as a volume resonator during the transmit phase, and then is re-configured using PIN diode switches or the like as a decoupled array of conductor loops that serve as coils of a SENSE coil array or other parallel imaging receive array. This approach does not provide flexibility in positioning the conductor loops relative to the imaging subject.

Another difficulty with existing radio frequency coils is loading-induced $B_1$ field inhomogeneity. For static $B_0$ magnetic fields greater than about 1 Tesla, inclusion of a region of a patient or other imaging subject inside the coil can substantially distort the $B_1$ field, leading to an inhomogeneous $B_1$ field. This inhomogeneity can be reduced by designing the radio frequency coil using design modeling that accounts for the coil loading. However, the birdcage coil has a limited number of design parameters, such as the number of rungs, coupling reactances between the rungs and end-rings, and so forth, which limits the extent to which birdcage coil design can counteract asymmetric coil loading.

The following contemplates improvements that overcome the aforementioned limitations and others.

SUMMARY

According to one aspect, a radio frequency coil is disclosed. A non-cylindrical conformal surface substantially conforms with a magnetic resonance subject. A plurality of conductor loops are disposed in or on the non-cylindrical conformal surface. The plurality of conductor loops are configured to produce a substantially uniform $B_1$ field in the magnetic resonance subject responsive to energizing at a $B_1$ frequency.

According to another aspect, a magnetic resonance scanner is disclosed. A main magnet generates a main $B_0$ magnetic field in a region of interest. Magnetic field gradient coils selectively superimpose magnetic field gradients on the main $B_0$ magnetic field. A radio frequency coil as set forth in the preceding paragraph conformably surrounds a magnetic resonance subject and selectively produces a substantially uniform $B_1$ field in the magnetic resonance subject.

According to another aspect, a radio frequency coil is disclosed. An operative radio frequency coil produces a $B_1$ field in a magnetic resonance subject. A load-compensating radio frequency coil includes a plurality of load-compensating conductor loops disposed in or on a compensatory non-cylindrical conformal surface that substantially conforms with the magnetic resonance subject. The plurality of load-compensating conductor loops are configured to produce a non-uniform $B_1$ field in the magnetic resonance subject that compensates for non-uniformity of the $B_1$ field generated by the operative radio frequency coil caused by the magnetic resonance subject.

According to another aspect, a process of configuring a radio frequency coil is disclosed. A non-cylindrical conformal surface is selected that substantially conforms with a magnetic resonance subject. A plurality of conductor loops disposed in or on the non-cylindrical conformal surface are configured to produce a substantially uniform $B_1$ field in the magnetic resonance subject responsive to energizing at a $B_1$ frequency.

According to another aspect, a radio frequency coil is disclosed, which is made by the process set forth in the preceding paragraph.

One advantage resides in providing a transmit/receive coil that substantially conforms with the form of the imaging subject.

Another advantage resides in providing a combined volume transmit coil and receive coil array substantially conforming with the form of the imaging subject.

Another advantage resides in providing a conformal auxiliary coil for compensating for coil loading effects.

Numerous additional advantages and benefits will become apparent to those of ordinary skill in the art upon reading the following detailed description of the preferred embodiments.

BRIEF DESCRIPTION OF THE DRAWINGS

The invention may take form in various components and arrangements of components, and in various process operations and arrangements of process operations. The drawings are only for the purpose of illustrating preferred embodiments and are not to be construed as limiting the invention.

DESCRIPTION

Figure 1:
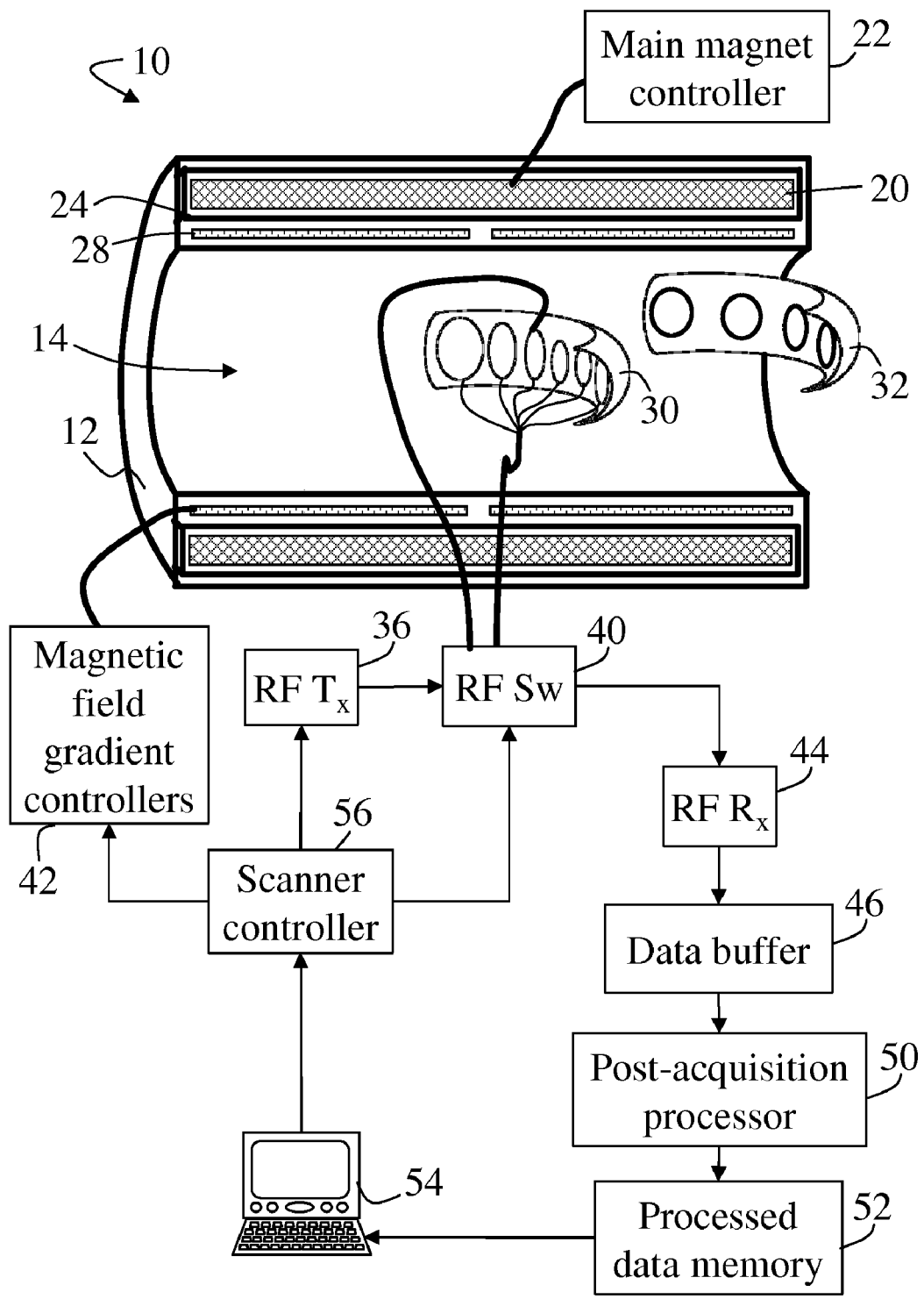
FIG. 1 diagrammatically shows a magnetic resonance system including a radio frequency shoulder coil and load-compensating radio frequency coil.

With reference to FIG. 1, a magnetic resonance scanner 10 includes a scanner housing 12 including a bore 14 or other receiving region for receiving a patient or other subject. A main magnet 20 disposed in the scanner housing 12 is controlled by a main magnet controller 22 to generate a main $B_0$ magnetic field at least in a region of interest of the bore 14. Typically, the main magnet 20 is a persistent superconducting magnet surrounded by cryoshrouding 24, although a resistive main magnet can be used.

Magnetic field gradient coils 28 are arranged in or on the housing 12 to superimpose selected magnetic field gradients on the main magnetic field at least in a region of interest. Typically, the magnetic field gradient coils include coils for producing three orthogonal magnetic field gradients, such as an x-gradient, y-gradient, and z-gradient. A radio frequency coil 30 is disposed in the bore 14 of the scanner 10 to inject $B_1$ radio frequency excitation pulses. The radio frequency coil 30 is shaped to match the imaging subject. The illustrated example radio frequency coil 30 is shaped to match the shoulder of a human imaging subject. In the example illustrated embodiment, an additional load-compensating coil 32 is also provided to compensate for loading effects of the imaging subject on the radio frequency coil 30.

During magnetic resonance data acquisition, a radio frequency transmitter 36 is coupled to the radio frequency coil 30 via radio frequency switching circuitry 40 to generate magnetic resonance signals in a region of interest, such as a shoulder, of a subject disposed in the bore 14. A magnetic field gradients controller 42 operates the magnetic field gradient coils 28 to spatially localize, spatially encode, or otherwise manipulate the generated magnetic resonances. During the magnetic resonance readout phase, a radio frequency receiver 44 is coupled with the radio frequency coil 30 via the radio frequency circuitry switching circuitry 40 to receive magnetic resonance. A data buffer 46 stores samples of the received magnetic resonance signals. A post-acquisition processor 50 processes the acquired magnetic resonance data. For example, the post-acquisition processor 50 can include an image reconstruction processor that processes spatially encoded magnetic resonance data using a Fast Fourier Transform (FFT) or other reconstruction algorithm to generate a spatial map or image of the imaging subject. Other types of post-acquisition processing can also be performed. A processed data memory 52 stored the reconstructed image or other processed data. A user interface 54 displays the reconstructed image or other processed data to a user. In the example embodiment illustrated in FIG. 1, the user interface 54 also interfaces the user with a scanner controller 56 to control the magnetic resonance scanner 10. In other embodiments, a separate scanner control interface may be provided. In some embodiments, the post-acquisition processor 50, memories 46, 52, or other components are integrated in various ways, such as being software or built-in hardware components of the user interface 54 which in the illustrated embodiment is a computer.

Figure 2:
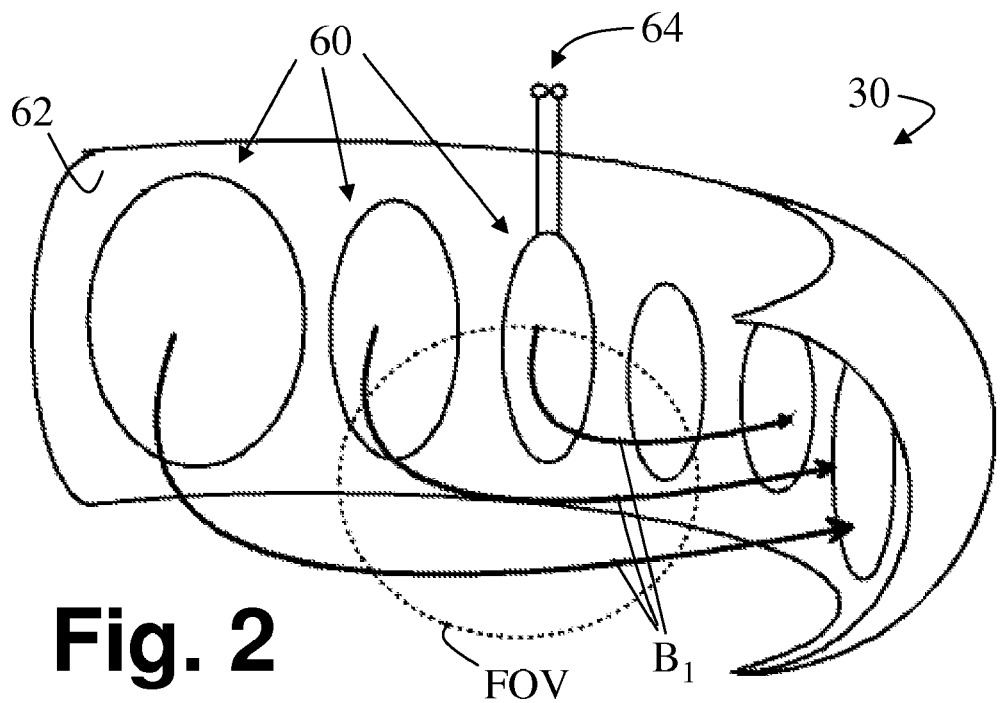
FIG. 2 diagrammatically shows the shoulder coil of FIG. 1 configured to operate as a volume resonator.

With reference to FIG. 2, operation of the radio frequency coil 30 during the transmit phase of the magnetic resonance sequence is described. The coil 30 includes a plurality of conductor loops 60 disposed in or on a conformal surface 62 that substantially conforms with the magnetic resonance subject (for example, a shoulder for the example radio frequency coil 30). The illustrated rigid conformal surface 62 is non-cylindrical and non-planar. The plurality of conductor loops 30 are configured to act as a volume resonator to produce a substantially uniform $B_1$ field in the magnetic resonance subject responsive to energizing at a $B_1$ frequency at a radio frequency excitation input port 64. The conductor loops 30 can be electromagnetically coupled by mutual inductance therebetween, or can be galvanically interconnected (galvanic connections not illustrated in FIGS. 2 and 3). During the excitation phase of the magnetic resonance sequence, the radio frequency transmitter 36 is connected with the excitation input port 64 of the radio frequency coil 30 via the radio frequency switching circuitry 40 to excite magnetic resonance. The energized conductor loops 30 produce a $B_1$ magnetic field $B_1$ that is substantially uniform within a field of view FOV depicted by a dotted boundary line in FIG. 2.

Figure 3:
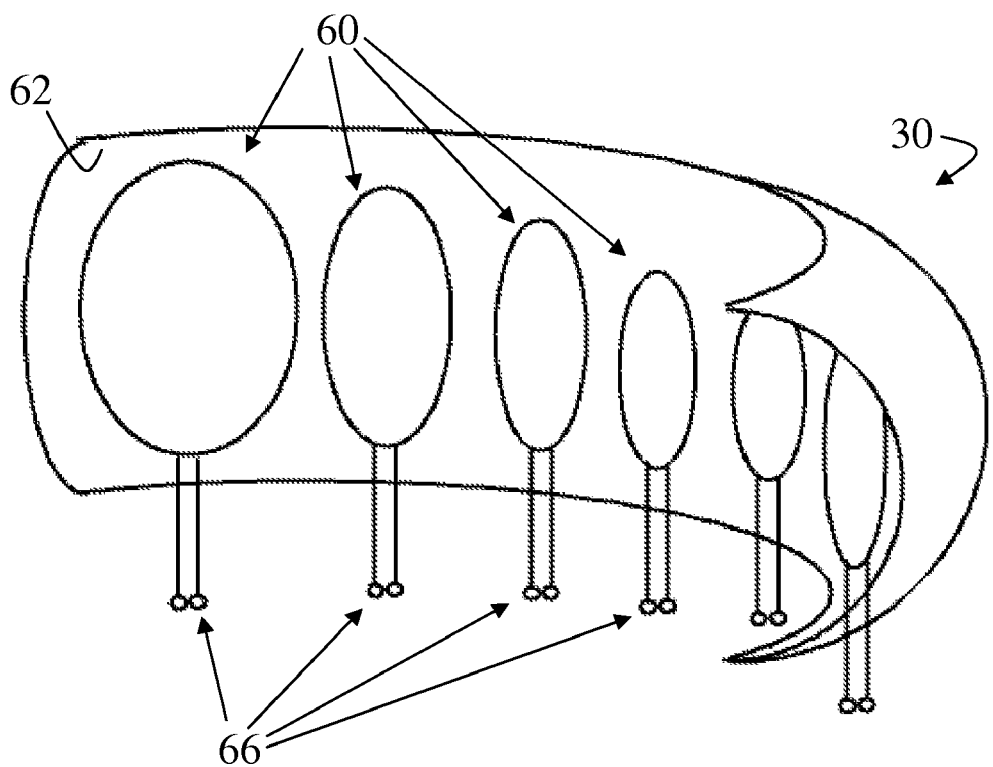
FIG. 3 diagrammatically shows the shoulder coil of FIG. 1 configured to operate as a coils array.

With reference to FIG. 3, operation of the radio frequency coil 30 during the receive phase of the magnetic resonance sequence is described. During the receive phase, the conductor loops 60 are operated as coil elements of a receive coils array. During the receive phase, each conductor loop 60 is connected with a corresponding readout port 66. The conductor loops 60 are decoupled, for example using a suitable pre-amplifier, and are resonant at the $B_1$ magnetic resonance frequency. Moreover, if galvanic connections between the conductor loops 60 are employed in the transmit phase, then these galvanic connections are disconnected during the receive phase, for example using PIN diode switches. PIN diode switches are also optionally used to switch in or out capacitors to tune the decoupled coil loops to the $B_1$ magnetic resonance frequency in the receive phase.

Design of the radio frequency coil 30 focuses on the characteristics of the volume resonator mode used in the transmit phase of the magnetic resonance sequence. The coil 30 is designed to ensure that the inductively or galvanically interconnected conductor loops 60 driven by radio frequency power applied at the radio frequency excitation input port 64 and at the magnetic resonance frequency produces a substantially uniform $B_1$ field in the magnetic resonance subject. The non-cylindrical conformal surface 62 is selected to substantially conform with external contours of the shoulder or other region of interest of the magnetic resonance subject. The plurality of conductor loops 60 are then defined on or in the non-cylindrical conformal surface 62 and configured so as to produce the substantially uniform $B_1$ field in the magnetic resonance subject responsive to energizing the input port 64 at the $B_1$ frequency.

A suitable process for defining and configuring the conductor loops 60 is to first determine a current density across the non-cylindrical conformal surface that corresponds with the substantially uniform $B_1$ field in the magnetic resonance subject based on the Biot-Savart relationship between electrical current and magnetic field and assuming the electric vector potential generated by the electrical current is everywhere normal to the non-cylindrical conformal surface 62 (that is, making an infinitesimally thin surface approximation), and then discretizing the determined current density to define the plurality of conductor loops 60. The discretizing is in one approach suitably performed by selecting the topology of the conductor loops 60, selecting currents in the conductor loops 60 that provide the desired magnetic field distribution in the quasi-static or low frequency domain, and adding capacitances (discrete or distributed) along the conductor loops 60 that maintain the defined current density at the higher $B_1$ frequency. The added capacitors compensate for inductive coupling between the conductor loops 60 at the higher $B_1$ frequency, and are suitably determined, for example, using the method of moments.

The radio frequency coil 30 provides strong coupling with the magnetic resonance subject due to its close conformance with the contours of the region of interest. Additionally, the close conformance typically provides a more compact coil than, for example, a corresponding local cylindrical birdcage coil. Additionally, because the design process typically produces the conductor loops 60 with significant variations in coil size, shape, and orientation, the conductor loops 60 typically have significant variations in coil sensitivity, which can be advantageous for parallel imaging techniques such as SENSE which benefit from employing a coils array of coil elements having varying sensitivity factors.

Figure 4:
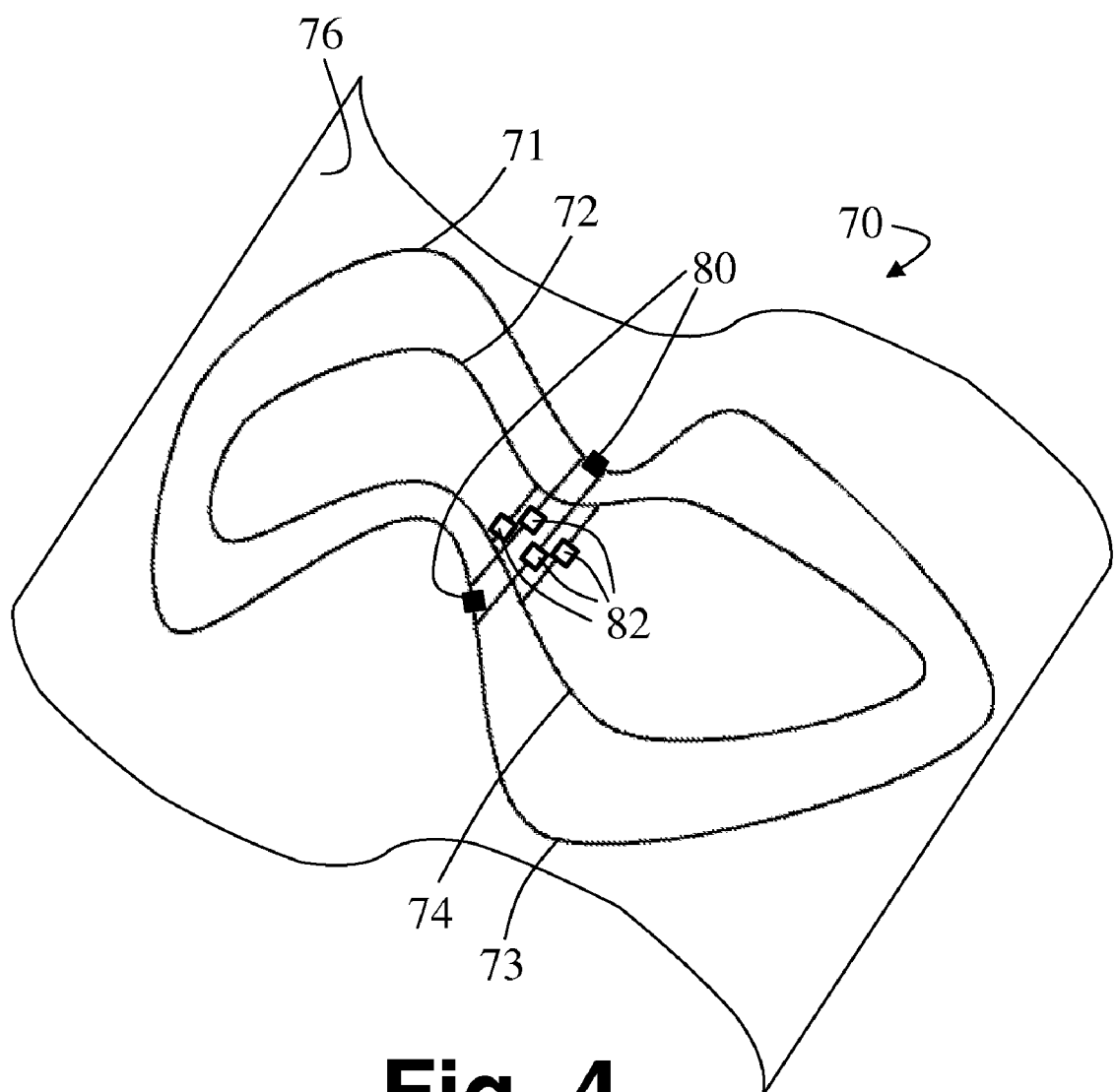
FIG. 4 diagrammatically shows another conformal radio frequency coil.

With reference to FIG. 4, an approach for switching galvanic connections of conductor loops to switch between the transmit volume resonator mode and the receive coil array mode is described. In the illustrated example of FIG. 4, a radio frequency coil 70 includes four conductor loops 71, 72, 73, 74 disposed on or in a rigid conformal surface 76. The illustrated rigid conformal surface 76 is non-cylindrical and non-planar. The conductor loop 71 is an outer conductor loop that surrounds the inner conductor loop 72. The conductor loop 73 is an outer conductor loop that surrounds the inner conductor loop 74.

Figure 5A:
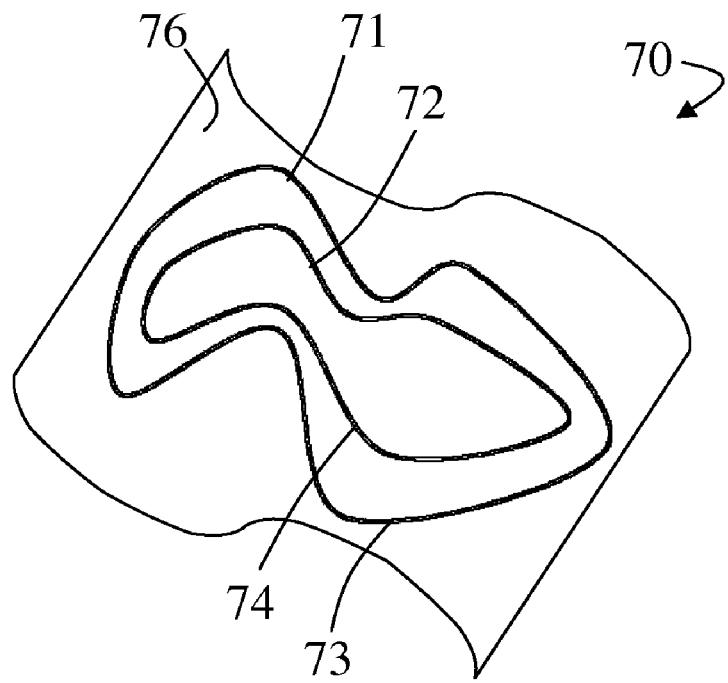
FIG. 5A diagrammatically shows the coil of FIG. 4 configured to operate as a volume resonator.

In the transmit mode, a first set of PIN diode switches 80 (diagrammatically depicted as filled squares in FIG. 4) are closed while a second set of PIN diode switches 82 (diagrammatically depicted as unfilled squares in FIG. 4) are open. This produces the operative volume resonator mode coil configuration shown in FIG. 5A, in which the two outer conductor loops 71, 73 are connected together to define a large outer operative conductor loop, while the two inner conductor loops 72, 74 are connected together to define a large inner operative conductor loop.

Figure 5B:
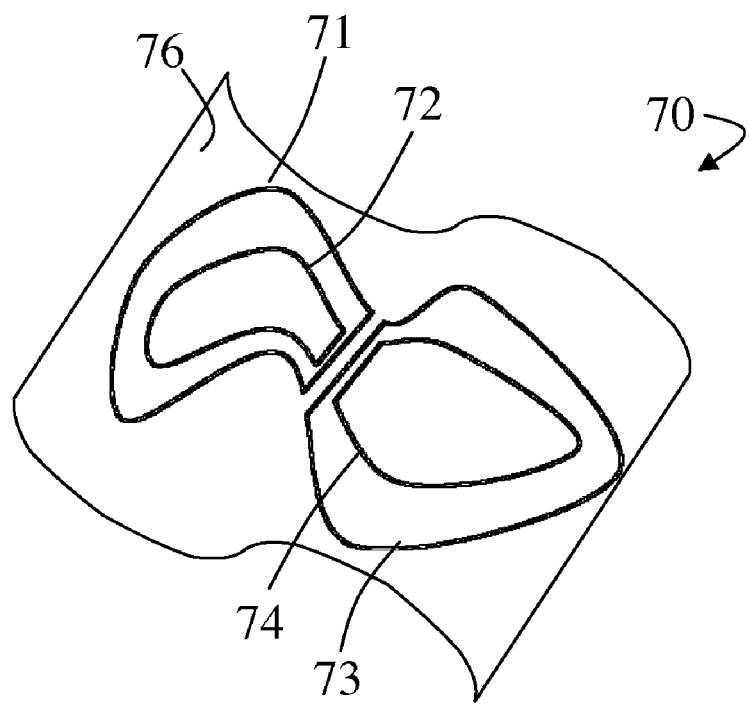
FIG. 5B diagrammatically shows the coil of FIG. 4 configured to operate as a coil array.

On the other hand, in the receive mode, the first set of PIN diode switches 80 are open while a second set of PIN diode switches 82 are closed. This produces the operative coils array mode coil configuration shown in FIG. 5B, in which each of the four conductor loops 71, 72, 73, 74 are decoupled to define a four-coil array.

With returning reference to FIG. 1, the example illustrated embodiment, an additional load-compensating coil 32 is also provided to compensate for loading effects of the imaging subject on the radio frequency coil 30. The load-compensating coil 32 compensates for non-uniformities of the $B_1$ field produced by the coil 30 in the presence of substantial loading by the magnetic resonance subject. The load-compensating coil 32 is designed similarly to the design of the radio frequency coil 30, except that the current density across the non-cylindrical conformal surface is determined to produce a spatially non-uniform $B_1$ field in the magnetic resonance subject that compensates for loading effects of the radio frequency coil 30. The illustrated load-compensating coil 32 is a passive coil that inductively couples with the electromagnetic field produced by the radio frequency coil 30 to compensate for loading effects. In other embodiments, the load-compensating coil may be an active coil. In the embodiment of FIG. 1, the radio frequency coil 30 and the load-compensating coil 32 are separate. The separation between the radio frequency coil 30 and the load compensating coil 32 is exaggerated for simplicity of illustration in FIG. 1.

Figure 6:
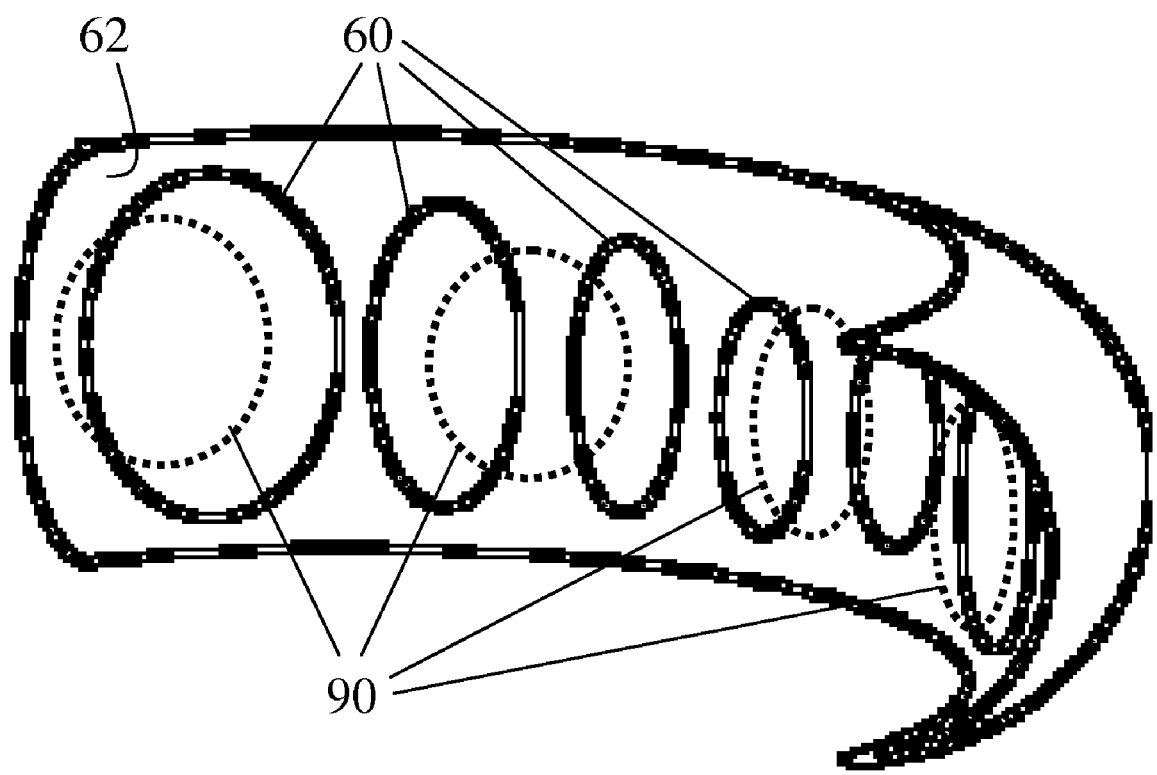
FIG. 6 diagrammatically shows the radio frequency shoulder coil and load-compensating radio frequency coils of FIG. 1 in an embodiment in which the conductor loops of the shoulder coil and the load-compensating coil are disposed on opposite sides of a common conformal surface.

With reference to FIG. 6, it is advantageous for both the radio frequency coil and the load-compensating radio frequency coil to be compact and closely coupled with the magnetic resonance subject. Accordingly, in some embodiments, opposite sides of the same conformal surface 62 supports conductor loops 60 of the radio frequency coil and additional coil loops 80 of the load-compensating coil. For example, the illustrated radio frequency coil 30' includes the conductor loops 60 of the radio frequency coil on the inside of the conformal surface 62, and includes the conductor loops 80 of the load compensating coil on the outside of the conformal surface 62. Since the outside of the conformal surface 62 is hidden in the vantage of FIG. 6, the conductor loops 80 of the load compensating coil on the outside of the conformal surface 62 are drawn using dotted lines. In other contemplated embodiments, the radio frequency coil and the load compensation coil can be a common coil on the same side of the conformal surface, rather than on opposite sides. The common coil is driven by an electrical current to produce a total field which is homogeneous under the load.

In selecting the topology of the conductor loops it is advantageous to use few loops to reduce coupling. However, the number of conductor loops should be large enough to closely approximate the computed current density across the non-cylindrical conformal surface. The number of conductor loops should also be large enough to provide the desired number of coil elements in the receive coils array. Various topologies can be used, including for example the non-overlapping conductor loops arrangement of the coil 30 of FIGS. 2 and 3, and/or nested conductor loops of the coil 70 of FIG. 4, or various combinations thereof. Moreover, in the volume resonator mode the conductor loops can be galvanically interconnected, inductively interconnected, or some conductor loops can be galvanically interconnected and others inductively interconnected. In the illustrated embodiments the radio frequency coil is operated as a volume resonator in the transmit phase and as a coils array in the receive phase; however, it is also contemplated to use the volume resonator mode for both transmit and receive phases of the magnetic resonance sequence, or to use the coils array mode for both transmit and receive phases, or to use the coils array mode for the transmit phase and the volume resonator mode for the receive phase. The illustrated conformal surfaces 62, 76 of the respective coils 30, 70 are non-cylindrical and non-planar; however, radio frequency coils as disclosed herein are also contemplated to be constructed for a cylindrical surface or a planar surface that substantially conforms with a cylindrical or planar contour.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A transmit/receive radio frequency coil for parallel imaging comprising:
   a non-cylindrical conformal surface that substantially conforms with a magnetic resonance subject;
   a plurality of conductor loops disposed in or on the non-cylindrical conformal surface;
   one or more switches connected with the conductor loops, the one or more switches being selectively switched to (i) interconnect the plurality of conductor loops configured as a volume transmit resonator to produce a substantially uniform $B_1$ field across an imaging volume of the magnetic resonance subject responsive to energizing at a $B_1$ frequency in a transmit mode and (ii) de-couple the conductor loops in a receive mode to define a receive coil array of decoupled conductor loops which each receive resonance signals from across the imaging volume, the conductor loops each being resonant at the $B_1$ frequency in both the transmit mode and the receive mode;
   wherein the plurality of conductor loops when energized at the $B_1$ frequency define a discretized current density across the non-cylindrical conformal surface that corresponds with the substantially uniform $B_1$ field in the magnetic resonance subject, and at least one of:
   (i) wherein the plurality of conductor loops define the discretized current density when energized in the quasi-static domain, capacitance along the conductors maintaining the defined discretized current density at the $B_1$ frequency, and
   (ii) wherein at least some of the conductor loops are electromagnetically coupled by mutual inductance therebetween.

2. The radio frequency coil as set forth in claim 1, wherein the plurality of conductor loops define the discretized current density when energized in the quasi-static domain, capacitance along the conductors maintaining the defined current density at the $B_1$ frequency.

3. The radio frequency coil as set forth in claim 1, wherein at least some of the conductor loops are electromagnetically coupled by mutual inductance therebetween.

4. The radio frequency coil as set forth in claim 1, wherein the one or more switches interconnect the plurality of conductor loops in a series interconnected configuration in the transmit mode.

5. The radio frequency coil as set forth in claim 1, wherein the one or more switches galvanically interconnect the plurality of conductor loops in the volume transmit resonator configuration (i) and disconnect the plurality of conductor loops in the receive coil array configuration (ii).

6. The radio frequency coil as set forth in claim 1, wherein the non-cylindrical conformal surface is rigid and non-planar.

7. The radio frequency coil as set forth in claim 1, further including:
   a plurality of load-compensating conductor loops disposed in or on a compensatory non-cylindrical conformal surface that is configured to substantially conform with a magnetic resonance subject, the plurality of load-compensating conductor loops configured to produce a non-uniform $B_1$ field that compensates for a loading $B_1$ non-uniformity caused by the magnetic resonance subject.

8. The radio frequency coil as set forth in claim 7, wherein the non-cylindrical conformal surface and the compensatory non-cylindrical conformal surface are the same surface.

9. A magnetic resonance scanner comprising:
   a main magnet generating a main $B_0$ magnetic field in a region of interest;
   magnetic field gradient coils selectively superimposing magnetic field gradients on the main $B_0$ magnetic field;
   a radio frequency coil as set forth in claim 1 conformably surrounding a magnetic resonance subject and selectively producing the substantially uniform $B_1$ field in the magnetic resonance subject; and
   a parallel imaging reconstruction processor which receives the resonance signals from the decoupled conductor loops in the receive mode and reconstructs the received resonance signals into an image representation.

10. A magnetic resonance scanner comprising:
    a main magnet generating a main $B_0$ magnetic field in a region of interest;
    magnetic field gradient coils selectively superimposing magnetic field gradients on the main $B_0$ magnetic field;
    a radio frequency coil conformably surrounding a magnetic resonance subject and selectively producing a substantially uniform $B_1$ field in the magnetic resonance subject, the radio frequency coil including:
    a non-cylindrical conformal surface that substantially conforms with a magnetic resonance subject,
    a plurality of conductor loops disposed in or on the non-cylindrical conformal surface, the plurality of conductor loops configured to produce a substantially uniform $B_1$ field in the magnetic resonance subject responsive to energizing at a $B_1$ frequency, and
    a plurality of load-compensating conductor loops disposed in or on a compensatory non-cylindrical conformal surface that substantially conforms with a magnetic resonance subject, the plurality of load-compensating conductor loops configured to produce a non-uniform $B_1$ field in the magnetic resonance subject that compensates for non-uniformity of the $B_1$ field in the magnetic resonance subject caused by the magnetic resonance subject.

11. The magnetic resonance scanner as set forth in claim 10, further comprising:
    a switch for switching the plurality of conductor loops between a transmit volume resonator and a receive coil array.

12. The magnetic resonance scanner as set forth in claim 10, wherein the non-cylindrical conformal surface and the compensatory non-cylindrical conformal surface are the same surface.

13. A radio frequency coil comprising:
    an operative radio frequency coil for producing a $B_1$ field in a magnetic resonance subject; and
    a load-compensating radio frequency coil including a plurality of load-compensating conductor loops disposed in or on a compensatory non-cylindrical conformal surface that substantially conforms with the magnetic resonance subject, the plurality of load-compensating conductor loops configured to produce a non-uniform $B_1$ field in the magnetic resonance subject that compensates for non-uniformity of the $B_1$ field generated by the operative radio frequency coil caused by the magnetic resonance subject.

14. The radio frequency coil as set forth in claim 13, wherein the load compensating coil is one of an active coil and a passive coil.

15. The radio frequency coil as set forth in claim 13, wherein the non-cylindrical conformal surface and the compensatory non-cylindrical conformal surface are the same surface.

16. A process of configuring a radio frequency coil, the process comprising:
- selecting a non-cylindrical conformal surface that substantially conforms with a magnetic resonance subject;
- configuring a plurality of conductor loops disposed in or on the non-cylindrical conformal surface to produce a substantially uniform $B_1$ field in the magnetic resonance subject responsive to energizing at a $B_1$ frequency;
- determining a load-compensating current density across a load-compensating conformal surface that compensates for non-uniformity of the $B_1$ field generated by the plurality of conductor loops; and
- discretizing the determined load-compensating current density to define a plurality of load-compensating conductor loops disposed on or in the load-compensating conformal surface.

17. The process as set forth in claim 16, further including:
- determining a current density across the non-cylindrical conformal surface that corresponds with the substantially uniform $B_1$ field in the magnetic resonance subject; and
- discretizing the determined current density to define the plurality of conductor loops.

18. The process as set forth in claim 16, further comprising:
- providing one or more switches for switching the plurality of conductor loops between a transmit volume resonator and a receive coil array.

19. The process as set forth in claim 16, wherein the configuring comprises:
- configuring a plurality of conductor loops disposed in or on the non-cylindrical conformal surface to produce a substantially uniform $B_1$ field with the magnetic resonance subject loaded and the coil energized at the $B_1$ frequency.

20. A radio frequency coil made by the process of claim 16.

* * * * *